United States Patent
Yang

(10) Patent No.: US 11,403,166 B2
(45) Date of Patent: Aug. 2, 2022

(54) CYCLIC REDUNDANCY CHECK CIRCUIT AND METHOD AND APPARATUS THEREOF, CHIP AND ELECTRONIC DEVICE

(71) Applicants: Gree Electric Appliances (Wuhan) Co., Ltd., Hubei (CN); Gree Electric Appliances Inc. of Zhuhai, Guangdong (CN)

(72) Inventor: Weiping Yang, Guangdong (CN)

(73) Assignees: GREE ELECTRIC APPLIANCES (WUHAN) CO., LTD., Hubei (CN); GREE ELECTRIC APPLIANCES INC. OF ZHUHAI, Guandong (CN)

( * ) Notice: Subject to any disclaimer, the term of this patent is extended or adjusted under 35 U.S.C. 154(b) by 61 days.

(21) Appl. No.: 16/612,681

(22) PCT Filed: Dec. 26, 2017

(86) PCT No.: PCT/CN2017/118622
§ 371 (c)(1),
(2) Date: Nov. 11, 2019

(87) PCT Pub. No.: WO2018/205633
PCT Pub. Date: Nov. 15, 2018

(65) Prior Publication Data
US 2020/0081767 A1   Mar. 12, 2020

(30) Foreign Application Priority Data
May 11, 2017   (CN) .......................... 201710330855.4

(51) Int. Cl.
*G06F 11/10* (2006.01)
*H03M 13/15* (2006.01)
*H03M 13/09* (2006.01)

(52) U.S. Cl.
CPC ....... *G06F 11/1004* (2013.01); *H03M 13/157* (2013.01)

(58) Field of Classification Search
CPC ............ G06F 11/1004; H03M 13/157; H03M 13/091
See application file for complete search history.

(56) References Cited

U.S. PATENT DOCUMENTS

| | | | |
|---|---|---|---|
| 7,434,150 B1 | 10/2008 | Barash | |
| 2012/0311411 A1* | 12/2012 | Kirkpatrick | G06F 11/1004 714/807 |

(Continued)

FOREIGN PATENT DOCUMENTS

| | | |
|---|---|---|
| CN | 101795175 A | 8/2010 |
| CN | 102318250 A | 1/2012 |

(Continued)

OTHER PUBLICATIONS

International Search Report, dated Mar. 19, 2018, for PCT/CN2017/118622 (4 pgs.).

(Continued)

*Primary Examiner* — April Y Blair
*Assistant Examiner* — Matthew W Wahlin
(74) *Attorney, Agent, or Firm* — Armstrong Teasdale LLP

(57) ABSTRACT

Provided are a Cyclic Redundancy Check (CRC) circuit, and a method and an apparatus thereof, a chip and an electronic device, which belong to the technical field of computers. Herein, the cyclic redundancy check circuit may include: a configuration module configured to acquire configuration information and an information field, a CRC arbitration module configured to determine a generator polynomial according to the configuration information, a CRC control module configured to respond to triggering of the CRC arbitration module and output a clock signal, a coefficient corresponding to each power in the generator polynomial (Continued)

and the information field, a parallel iteration module configured to respond to the clock signal and implement parallel iteration for the information field according to the coefficient corresponding to the each power in the generator polynomial, as to output an iteration result, and a CRC output module configured to package the information field according to the iteration result.

16 Claims, 6 Drawing Sheets

(56) References Cited

U.S. PATENT DOCUMENTS

2012/0317466 A1    12/2012   Lu
2017/0075754 A1*   3/2017   Wang ................ H03M 13/091

FOREIGN PATENT DOCUMENTS

| CN | 102891685 A | * | 1/2013 |
| CN | 103199873 A | | 7/2013 |
| CN | 103684682 A | | 3/2014 |
| CN | 103731239 A | | 4/2014 |
| CN | 103795502 A | * | 5/2014 |
| CN | 103795502 A | | 5/2014 |
| CN | 105099466 A | | 11/2015 |

OTHER PUBLICATIONS

Chen et al., An Improved Approach for Cyclic-Redundant-Code Generation and Circuit Implementation for 40 GB/s Ethernet, Microelectronics, Apr. 2015, 45(2), pp. 254-257, English Abstract provided.

* cited by examiner

| | g0 | | g1 | | g2 | | g3 | | g4 | | g5 | | g6 | | g7 | | g8 |
|---|---|---|---|---|---|---|---|---|---|---|---|---|---|---|---|---|---|---|
| | | | 1 | | 1 | | 1 | | 0 | | 0 | | 0 | | 0 | | 0 |
| d0 | R0 0 | | R1 0 | | R2 0 | | R3 0 | | R4 0 | | R5 0 | | R6 0 | | R7 0 | | C0=g8*R7 0 |
| 1 | 1 | | 0 | | 1 | | 0 | | 1 | | 0 | | 1 | | 0 | | 0 |
| | g0*C0 | | g1*C0 | | g2*C0 | | g3*C0 | | g4*C0 | | g5*C0 | | g6*C0 | | g7*C0 | | |
| | 0 | | 0 | | 0 | | 0 | | 0 | | 0 | | 0 | | 0 | | |
| d1 | R0 1 | | R1 1 | | R2 1 | | R3 1 | | R4 1 | | R5 1 | | R6 1 | | R7 1 | | C1=g8*R7 1 |
| 1 | 1 | | 1 | | 0 | | 1 | | 0 | | 1 | | 0 | | 1 | | 1 |
| | g0*C1 | | g1*C1 | | g2*C1 | | g3*C1 | | g4*C1 | | g5*C1 | | g6*C1 | | g7*C1 | | |
| | 1 | | 1 | | 1 | | 1 | | 0 | | 0 | | 0 | | 0 | | |
| | R0 2 | | R1 2 | | R2 2 | | R3 2 | | R4 2 | | R5 2 | | R6 2 | | R7 2 | | C2=g8*R7 2 |
| | 0 | | 0 | | 0 | | 1 | | 1 | | 0 | | 1 | | 0 | | 0 |
| | g0*C2 | | g1*C2 | | g2*C2 | | g3*C2 | | g4*C2 | | g5*C2 | | g6*C2 | | g7*C2 | | |
| | 0 | | 0 | | 0 | | 0 | | 0 | | 0 | | 0 | | 0 | | |
| | R0 3 | | R1 3 | | R2 3 | | R3 3 | | R4 3 | | R5 3 | | R6 3 | | R7 3 | | C3=g8*R7 3 |
| | 0 | | 0 | | 0 | | 0 | | 1 | | 1 | | 0 | | 1 | | 1 |
| | g0*C3 | | g1*C3 | | g2*C3 | | g3*C3 | | g4*C3 | | g5*C3 | | g6*C3 | | g7*C3 | | |
| | 1 | | 1 | | 1 | | 1 | | 0 | | 0 | | 0 | | 0 | | |
| | R0 4 | | R1 4 | | R2 4 | | R3 4 | | R4 4 | | R5 4 | | R6 4 | | R7 4 | | |
| | 1 | | 1 | | 1 | | 1 | | 0 | | 1 | | 1 | | 0 | | 1 |

FIG. 7

CYCLIC REDUNDANCY CHECK CIRCUIT AND METHOD AND APPARATUS THEREOF, CHIP AND ELECTRONIC DEVICE

CROSS REFERENCE TO RELATED APPLICATIONS

This application is the national stage entry of PCT/CN2017/118622, filed on Dec. 26, 2017, which claims priority to Chinese Patent Application No. 201710330855.4, filed on May 11, 2017, which are hereby incorporated by reference in their entirety.

TECHNICAL FIELD

The embodiments of the present disclosure relate to the technical field of computers, and in particular to a cyclic redundancy check (CRC) circuit and a method and an apparatus thereof, a chip and an electronic device.

BACKGROUND

A Cyclic Redundancy Check (CRC) code is used for checking correctness and integrity of data transmission, and a CRC operation may have a strong error detecting capability and may be easily achieved with a coder or a detection circuit.

FIG. 1 is a structure diagram of a CRC8 serial shift circuit provided by a traditional technology. As shown in FIG. 1, a generator polynomial of the circuit is: $G = g_8 X^8 + g_7 X^7 + \ldots + g_1 X^1 + 1$, and by which a shift may be implemented to calculate a CRC check code.

The traditional technology has at least the following problems: a clock period may be needed at every input of an one-bit information code d during CRC calculation, and n clock periods may be needed when the information codes of totally n bits $d_0, d_1 \ldots d_{n-1}$ are input. Therefore, during the CRC calculation, more time may be needed to input a multi-bit information code, thereby leading to a redundant CRC calculation time.

SUMMARY

The embodiments of the present disclosure provide the following technical solutions.

According to a first aspect, the embodiment of the present disclosure discloses a cyclic redundancy check circuit, and the circuit may include: a configuration component configured to acquire configuration information and an information field, a CRC arbitration component configured to determine a generator polynomial according to the configuration information, a CRC control component configured to respond to triggering of the CRC arbitration component and output a clock signal, a coefficient corresponding to each power in the generator polynomial and the information field, a parallel iteration component configured to respond to the clock signal and implement parallel iteration for the information field according to the coefficient corresponding to the each power in the generator polynomial, as to output an iteration result, and a CRC output component configured to package the information field according to the iteration result.

According to a second aspect, the embodiment of the present disclosure provides a CRC method. The method may include: configuration information and an information field are acquired, a generator polynomial and a coefficient corresponding to each power in the generator polynomial are determined according to the configuration information, parallel iteration is implemented for the information field according to the coefficient corresponding to the each power in the generator polynomial, as to output an iteration result, and the information field is packaged according to the iteration result.

According to a third aspect, the embodiment of the present disclosure provides a CRC apparatus. The apparatus may include: an acquiring component configured to acquire configuration information and an information field, a determining component configured to determine a generator polynomial and a coefficient corresponding to each power in the generator polynomial according to the configuration information, an iteration component configured to implement parallel iteration for the information field according to the coefficient corresponding to the each power in the generator polynomial, as to output an iteration result, and a packaging component configured to package the information field according to the iteration result.

According to a fourth aspect, the embodiment of the present disclosure provides a chip, and the chip may include any one of the abovementioned CRC circuits.

According to a fifth aspect, the embodiment of the present disclosure provides a non-volatile computer readable storage medium, the non-volatile computer readable storage medium stores an instruction executable by an electronic device, and the executable instruction is used for making the electronic device implement any one of the abovementioned CRC methods.

According to a sixth aspect, an electronic device may include at least one processor and a memory which is in communication connection with the at least one processor, herein, the memory stores an instruction executable by the at least one processor, and the instruction is implemented by the at least one processor, as to make the at least one processor to be applied to any one of the abovementioned CRC methods.

BRIEF DESCRIPTION OF THE DRAWINGS

One or more embodiments are exemplified by pictures in corresponding accompanying drawings, and these exemplary descriptions do not constitute a limitation to the embodiments. Elements in the drawings having the same reference numerals indicate the like elements, and unless otherwise stated, the figures in the drawings do not constitute a proportional limitation.

FIG. 7 is an iteration table of FIG. 6.

DETAILED DESCRIPTION OF THE EMBODIMENTS

Figure 1:
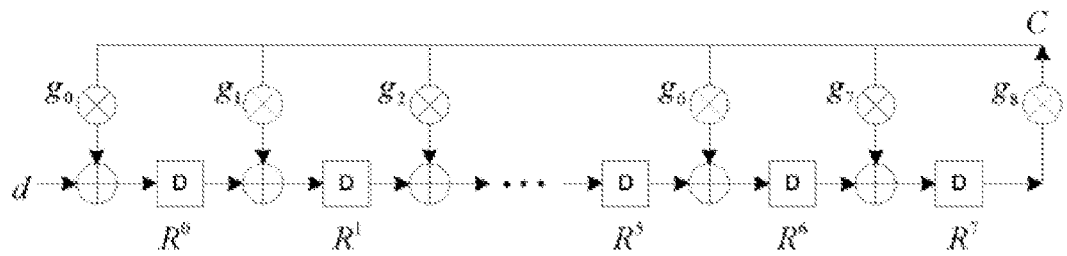
FIG. 1 is a structure diagram of a Cyclic Redundancy Check (CRC) 8 serial shift circuit provided by a traditional technology.

In order to make the purposes, technical solutions and advantages of the present disclosure clearer, the present disclosure will be further described in detail below in combination with the accompanying drawings and embodiments. It is to be understood that the specific embodiments described herein are merely illustrative of the present disclosure and are not intended to limit the present disclosure.

A Cyclic Redundancy Check (CRC) principle is to add a (N-R)-bit binary check code (sequence) behind a K-bit binary data sequence, as to constitute a binary sequence with a total length of N=K+R bits. There is a certain specific relation between the check code added behind the data sequence and a content of the data sequence. If a certain bit or certain bits in the data sequence are trapped in an error due to interference and other reasons, the specific relation may be damaged. Hereby, correctness of the data sequence may be checked by checking this kind of relation through a CRC check algorithm or the CRC check circuit.

During CRC check, a sender and a receiver need to agree on a divisor in advance, namely, a generator polynomial which is generally recorded as G(x). A highest bit and a lowest bit of the generator polynomial must be 1. In some embodiments of the disclosure the generator polynomial of a usual CRC code may include:

$CRC8 = X8 + X5 + X4 + 1;$ $CRC\text{-}CCITT = X16 + X12 + X5 + 1;$ $CRC16 = X16 + X15 + X5 + 1;$ $CRC12 = X12 + X11 + X3 + X2 + 1;$ $CRC32 = X32 + X26 + X23 + X22 + X16 + X12 + X11 + X10 + X8 + X7 + X5 + X4 + X2 + X1 + 1.$ Further, as the above, in order to check the error, the (N-R)-bit redundancy code needs to be added behind the k-bit information field.

Further, during the CRC check, a mod 2 calculation method needs to be used. The so-called mod 2 calculation method is bitwise exclusive-or calculation, namely, it is 0 if identical and 1 if different, in other words, a binary addition and subtraction without regard to carry and abdication. For example, 10011011+11001010=01010001.

A calculation principle of the CRC check code is as follows.

The information field is set to be K bits, a check field is set to be R bits, and accordingly a code length is N (N=K+R). In some embodiments of the disclosure, it is supposed that two parties involved agree on a R-order polynomial g(x), the CRC code may be calculated:

$V(x) = A(x)g(x) = xRm(x) + r(x)$

Herein, m(x) is a K-order information polynomial, and r(x) is an R-1-order check polynomial.

A code corresponding to r(x) is a redundancy code, namely, the redundancy code is added behind the former information field, thereby forming the CRC code.

A calculation method of r(x) is: R zeros are added behind the K-bit information field, a code sequence corresponding to g(x) is divided, a remainder acquired is the code (it should be (R-1) bits, and 0 should be supplemented at a high bit if not sufficient) corresponding to r(x).

For example, the code of the information field is: 1011001; and corresponding m(x)=x6+x4+x3+1.

It is supposed that the generator polynomial is: g(x)=x4+x3+1, and accordingly the code of the corresponding g(x) is: 11001.

A code corresponding to x4m(x)=x10+x8+x7+x4 is: 10110010000;

A division of polynomials is taken, to acquire the remainder: 1010 (namely, a check field is: 1010)

A sender: a transmission field sent by the sender is:

1 0 1 1 0 0 1 1 0 1 0

Information field  Check field

A receiver: the receiver may use an identical generating code to check: the received field/generating code (binary division), and it is correct if divisible.

Figure 2:
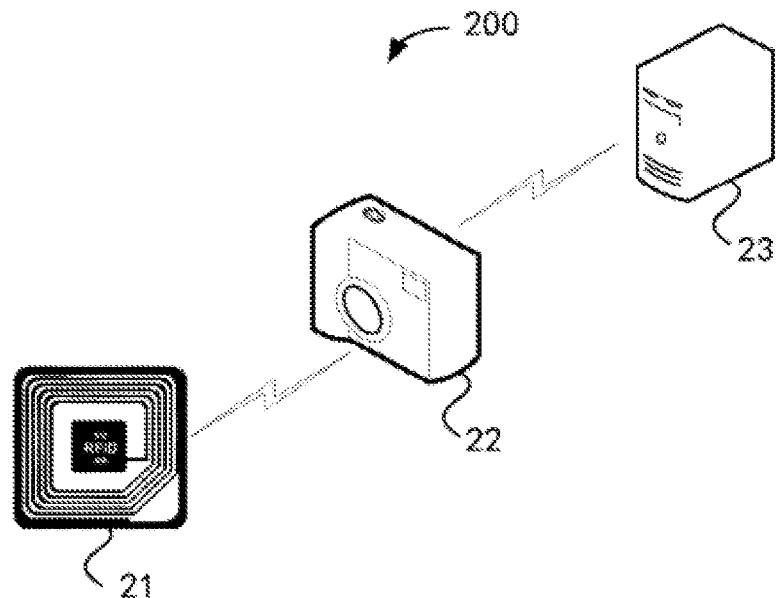
FIG. 2 is an application scene diagram of CRC check provided by an embodiment of the present disclosure.

In order to further elaborate an operational principle of the CRC check, the embodiment of the present disclosure provides an application scene of the CRC check. In some embodiments of the disclosure, as shown in FIG. 2, the application scene 200 may include the following elements: an electronic label 21, a reader-writer 22 and a cloud server 23. In some embodiments of the disclosure, the cloud server 23 may be a logic server virtually formed by one or more physical servers. In some embodiments of the disclosure, the cloud server 23 is a server cluster consisting of multiple servers which are in communication with each other.

In some embodiments of the disclosure, the electronic label 21 consist of a chip and a coupling element, and is provided with an antenna and the reader-writer therein for communication. A CRC check component is embedded in the reader-writer 22. When the reader-writer 22 sends communication data to the electronic label 21, the CRC check component may check and package the communication data with a preset generator polynomial, in this way the communication data may be transmitted more reliably. In some embodiments of the disclosure, upon receiving the communication data, the electronic label 21 may check the communication data with the identical generator polynomial, and return successful check information to the reader-writer 22 after successfully checking. The reader-writer 22 may send the successful check information to the cloud server 23 for storage, in order to facilitate a user to further develop the successful check information on the cloud server 23.

In some embodiments of the disclosure, the CRC check component may input an one-bit information code in the communication data with one piece of clock information when calculating the CRC check code according to the communication data, thereby causing that the reader-writer 22 fails to respond to the electronic label 21 quickly to complete a read-write process. Furthermore, the CRC check component fails to flexibly configure the corresponding generator polynomial according to a requirement of a communication protocol to more quickly or accurately calculate the CRC check code.

Figure 3:
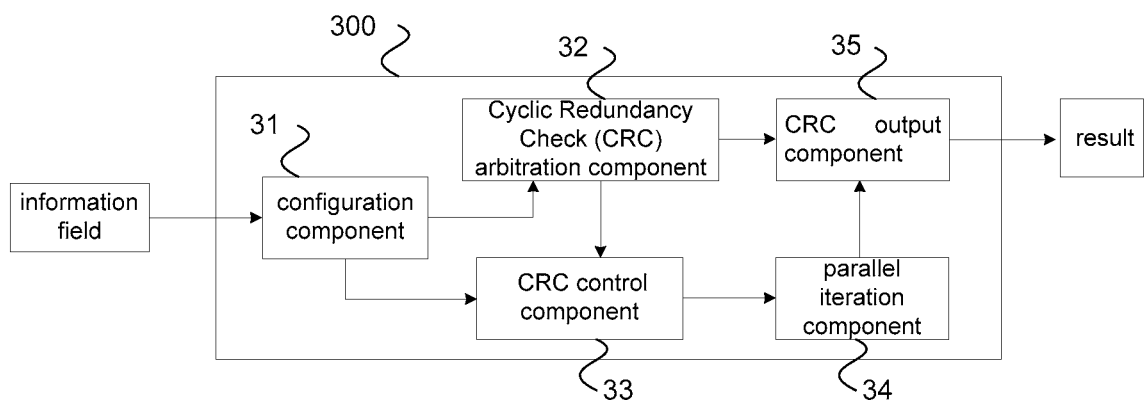
FIG. 3 is a structure diagram of a cyclic redundancy check circuit provided by an embodiment of the present disclosure.

The embodiment of the present disclosure hereby provides a Cyclic Redundancy Check (CRC) circuit. As shown in FIG. 3, the cyclic redundancy check circuit 300 may include a configuration component 31, a CRC arbitration component 32, a CRC control component 33, a parallel iteration component 34 and a CRC output component 35.

The configuration component 31 acquires configuration information and an information field. The configuration information may include a CRC type, a generator polynomial, a CRC initial value, information field overturning information and iteration result exclusive-or calculation and overturning information. The configuration information is used for indicating that the cyclic redundancy check circuit 300 selects the corresponding configuration information to complete CRC check and processing of output data. The CRC type may include any one of the follows: CRC4, CRC7, CRC8, CRC12, CRC16 and CRC32. The generator polynomial may include a generator polynomial type and a coefficient corresponding to each power in the generator polynomial, herein, the generator polynomial type may correspond to the CRC type, furthermore a user may define the generator polynomial type and the coefficient corresponding to the each power in the generator polynomial voluntarily according to a protocol or a product demand. The CRC initial value is used for initializing the parallel iteration component 34, herein, the CRC initial value may be a value defined in the protocol or an output value acquired after a last parallel iteration, a bit number of the CRC initial value is associated with that of iteration of the parallel iteration component 34. The information field overturning information is used for indicating that the configuration component 31 turns over each information code of the information field in advance according to the protocol. The iteration result exclusive-or calculation and overturning information is used for indicating that the CRC output component 35 implements exclusive-or calculation and overturning for an iteration result.

For example, the configuration information may include the information field overturning information, the configuration component 21 implements overturning for the information field in advance according to the information field overturning information, in order to facilitate complying with the protocol and outputting the pre-processed corresponding information field.

For example, the configuration information may include the CRC type or the generator polynomial. When the CRC type is CRC8 (CRC8=X8+X5+X4+1), the CRC arbitration component 32 may select the generator polynomial corresponding to the CRC8 to check and determine g0=1, g1=g2=g3=g4=0, g5=g6=1, g7=0, g8=1. When the CRC type is CRC16, similarly, the corresponding generator polynomial may be determined to be checked. Of course, the user may select a self-defined generator polynomial to check rather than select a standard CRC type, for example, g(x)=x5+x3+1. At the moment, the CRC arbitration component 32 determines that a coefficient of a quintic power is 1, a coefficient of a cubic power is 1, a coefficient of a zero power is 1, and coefficients of a first power, a quadratic power and a quartic power are 0 according to the generator polynomial.

In some embodiments of the disclosure, the configuration information may include the CRC initial value. When the CRC initial value is 01010101, the parallel iteration component 34 may receive an input of the CRC initial value and the information field at the same time, for iteration.

The information field is communication data sent to a receiver from a sender, and is a binary sequence.

The CRC arbitration component 32 sends a triggering signal to the CRC control component 33 upon determining the generator polynomial according to the configuration information, the CRC control component 33 sends a clock signal, and the coefficient corresponding to the each power in the generator polynomial and the information field to the parallel iteration component 34 according to the triggering signal, the parallel iteration component 34 responds to the clock signal and completes an input of the information field in parallel and implements parallel iteration for the information field according to the coefficient corresponding to the each power in the generator polynomial, as to output the iteration result. The CRC output component packages the information field according to the iteration result. The CRC output component 35 packages the information field according to the iteration result. The CRC output component 35 may implement exclusive-or calculation and overturning for the iteration result when packaging the information field and when the configuration information includes the iteration result exclusive-or calculation and overturning information.

Figure 4:
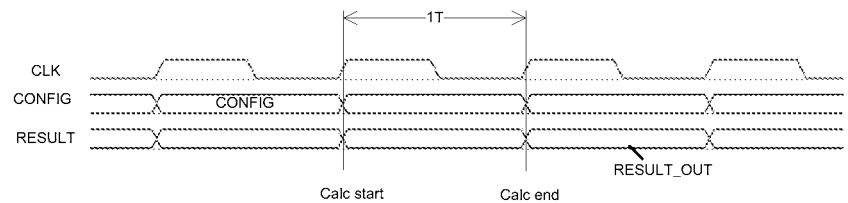
FIG. 4 is a sequence diagram of CRC check provided by an embodiment of the present disclosure.

To sum up, with the adoption of the cyclic redundancy check circuit 300, on one hand, as shown in FIG. 4, the parallel iteration of the information field may be completed with the clock signal of one period 1T only, in this way, an efficiency of CRC calculation may be improved. On the other hand, various configuration information may be flexibly configured, as to adapt to various CRC calculation requirements.

In some embodiments, the configuration information may include a (j-1)-bit CRC initial value. Furthermore, the parallel iteration component 34 may include i*j iteration units. Herein, an iteration unit in a row i-1 and a line 0 is configured to receive an information value of a corresponding bit in the information field. An iteration unit in a row 0 and a line j-1 is configured to respond to the clock signal and calculate an output value of the iteration unit in the row 0 and the line j-1 according to the CRC initial value and the coefficient of the corresponding power in the generator polynomial. An iteration unit in a row i and a line j is configured to respond to the clock signal and calculate an output value of the iteration unit in the row i and the line j according to an output value of an iteration unit in the row i-1 and the line j-1 and the coefficient of the corresponding power in the generator polynomial, and both i and j are positive integers.

In some embodiments of the disclosure, each of the iteration units includes at least one multiplier and at least one exclusive-or calculator. A multiplier of the row i-1 and the line j-1 is configured to multiply a coefficient corresponding to a highest power by a CRC initial value corresponding to a highest bit and the coefficient of the corresponding power and output a multiplication result. An exclusive-or calculator of the row i-1 and the line 0 is configured to implement exclusive-or calculation for the multiplication result and the information value of the corresponding bit in the information field and output an output value of the iteration unit of the row i-1 and the line 0. An exclusive-or calculator of the row 0 and the line j is configured to implement the exclusive-or calculation for the multiplication result and the CRC initial value corresponding to a bit j-1 and output an output value of an iteration unit of the row 0 and the line j. An exclusive-or calculator of the row i and the line j is configured to implement the exclusive-or calculation for the multiplication result and the output value of the iteration unit of the row i-1 and the line j-1 and output the output value of the iteration unit of the row i and the line j.

Figure 5:
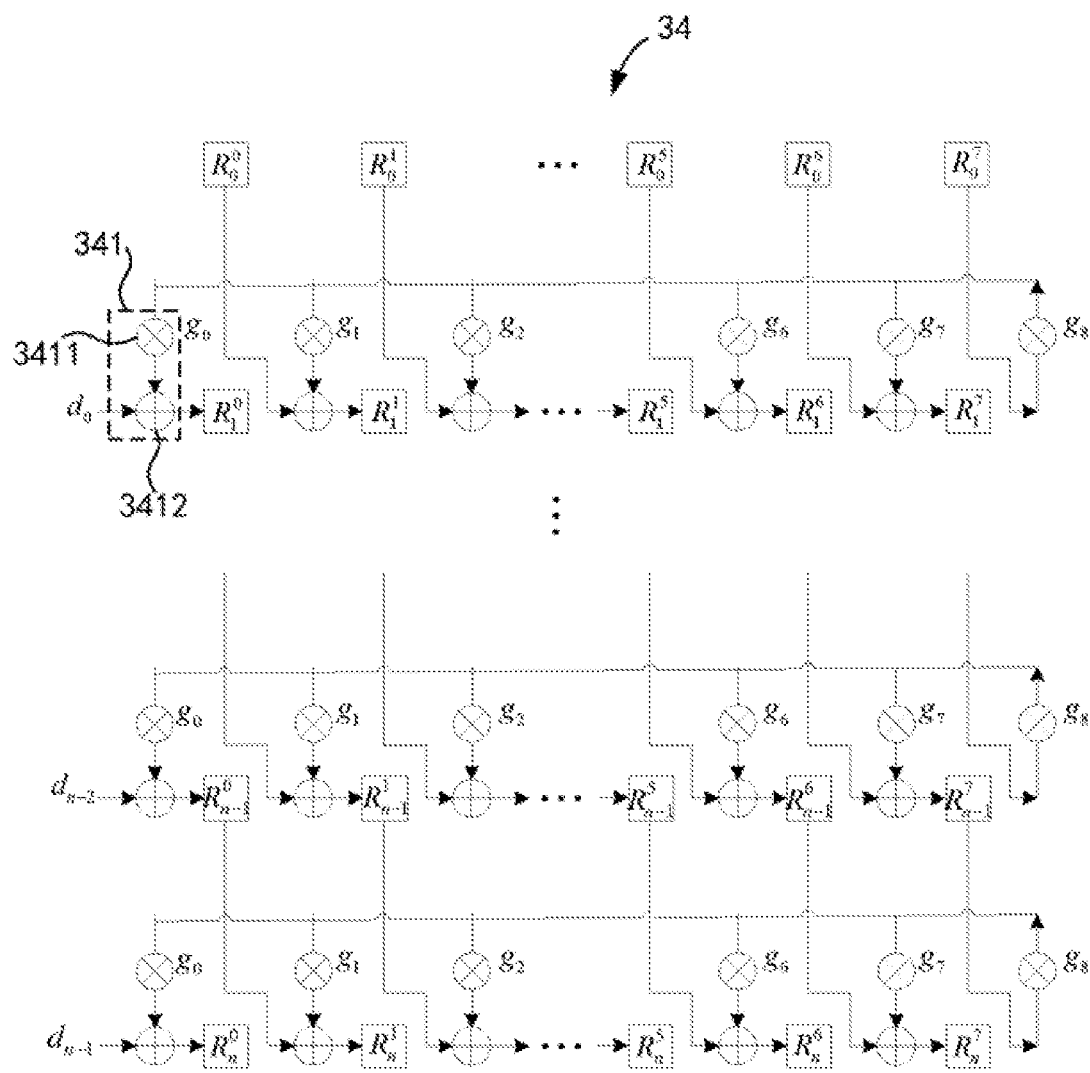
FIG. 5 is a structure diagram of a parallel iteration component taking a CRC8 type provided by an embodiment of the present disclosure.

In order to elaborate the parallel iteration component 34, the embodiments of the present disclosure may take CRC8 as an example, to elaborate an operational principle of the parallel iteration component 34. As shown in FIG. 5, the CRC initial value respectively is: $R^0_0, R^1_0, \ldots R^5_0, R^6_0, R^7_0$. The parallel iteration component 34 may include n*8 iteration units 341 (i=n, j=1, 2, 3, 4, 5, 6 and 7), n is a positive integer. Herein, an iteration unit in the row 0 and the line 0 is configured to receive the information value of the corresponding bit in the information field ($d_0, d_1 \ldots d_{n-2}, d_{n-1}$). The iteration unit in the row 0 and the line j-1 is configured to respond to the clock signal and calculate the output value of the iteration unit in the row 0 and the line j-1 according to the CRC initial value and the coefficient ($g_0, g_1, g_2 \ldots g_6, g_7, g_8$) of the corresponding power in the generator polynomial. An iteration unit in a row n and the line j is configured to respond to the clock signal and calculate an output value of the iteration unit in the row n and the line j according to an output value of an iteration unit in a row n-1 and a line j-1 and the coefficient of the corresponding power in the generator polynomial, and both n and j are positive integers.

In some embodiments of the disclosure, each of the iteration units includes at least one multiplier 3411 and at least one exclusive-or calculator 3412. The multiplier 3411 of the row i-1 and the line j-1 is configured to multiply the coefficient $g_8$ corresponding to the highest power by the CRC initial value $R^7_0$ corresponding to the highest bit and the coefficient ($R^0_0, R^1_0, \ldots R^5_0, R^6_0$) of the corresponding power and output the multiplication result. An exclusive-or calculator 3412 of the row n-1 and the line 0 is configured to implement the exclusive-or calculation for the multiplication result and the information value of the corresponding bit in the information field and output an output value of the iteration unit 341 of the row n-1 and the line 0. An exclusive-or calculator 3412 of the row 0 and the line j is configured to implement the exclusive-or calculation for the multiplication result and the CRC initial value corresponding to the bit j-1 and output an output value of the iteration unit 341 of the row 0 and the line j. An exclusive-or calculator 3412 of the row i and the line j is configured to implement the exclusive-or calculation for the multiplication result and an output value of an iteration unit 341 of the row i-1 and the line j-1 and output an output value of the iteration unit 341 of the row i and the line j.

Figure 6:
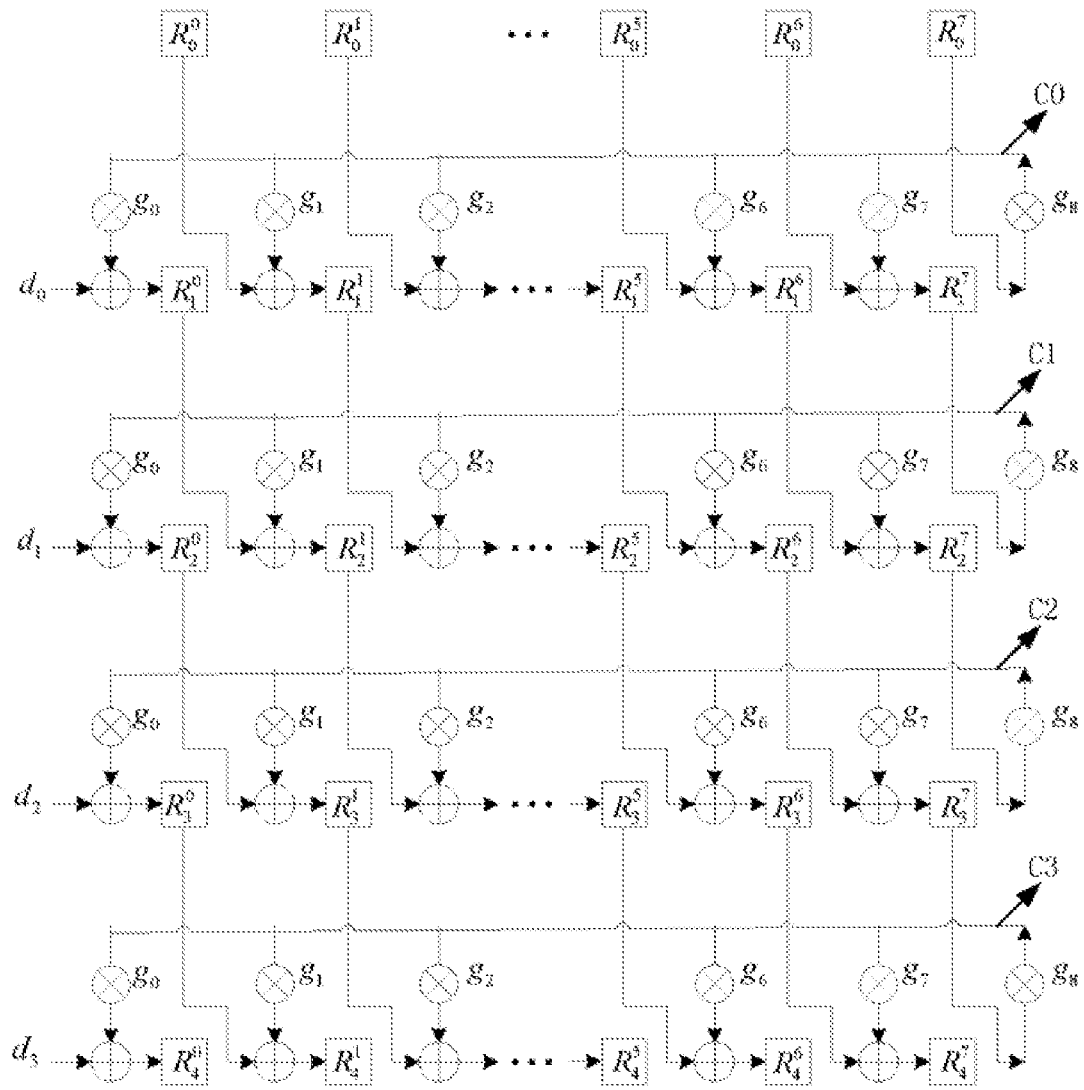
FIG. 6 is a structure diagram of a parallel iteration component taking a CRC8 type and iterating a four-bit information field provided by an embodiment of the present disclosure.

In order to further elaborate an iteration process of the embodiment shown in FIG. 5, the embodiments of the present disclosure provide the iteration process of a 4-bit information field. As shown in FIG. 6 and FIG. 7, information fields $d_0, d_1, d_2, d_3$ are 0011 respectively, CRC initial values $R^0_0, R^1_0, \ldots R^5_0, R^6_0, R^7_0$ are 01010101 respectively, and coefficients $g_0, g_1, g_2 \ldots g_6, g_7, g_8$ of corresponding powers in a generator polynomial are 100001111 respectively. A parallel iteration component 34 implements iteration according to the CRC initial value, the coefficient of the corresponding power in the generator polynomial and the information field, and iteration results $R^0_4, R^1_4, R^2_4, R^3_4, R^4_4, \ldots R^5_4, R^6_4, R^7_4$ are 01101111, respectively.

In some embodiments, a difference from each of the abovementioned embodiments lies in: the configuration information may include a CRC type and various coefficients of the generator polynomial. A CRC arbitration component determines a generator polynomial type and the coefficient corresponding to the each power in the generator polynomial according to the CRC type and the various coefficients of the generator polynomial. Therefore, the CRC arbitration component may not only determine the various coefficients of the generator polynomial according to the CRC type, but customize the various coefficients of the generator polynomial according to a protocol, as to determine the coefficient corresponding to the each power. In this way, the generator polynomial may be flexibly configured.

The embodiments of the present disclosure provides a chip, including any one of the abovementioned Cyclic Redundancy Check (CRC) circuits shown in FIG. 2-FIG. 7. Through the cyclic redundancy check circuit, the chip may complete parallel iteration of an information field with a clock signal of one period 1T only, in this way an efficiency of CRC calculation may be improved. On the other hand, various configuration information may be flexibly configured, as to adapt to various CRC calculation requirements.

In some embodiments of the disclosure, the chip may be a universal processor, a Digital Signal Processor (DSP), an Application Specific Integrated Circuit (ASIC), a Field Programmable Gate Array (FPGA), a single chip, an Acorn RISC Machine (ARM) or other programmable logic devices, a discrete element logic gate or transistor logic, a discrete hardware component or any combination of these parts. In addition, as an alternative, an embedded apparatus 112 may be any one of a traditional processor, a controller, a micro controller and a state machine. As an alternative, the processor may be a combination of computing devices, for example, a combination of the DSP and a microprocessor, multiple microprocessors, one or more microprocessors combining with a DSP core, or any other configurations like this.

Figure 8:
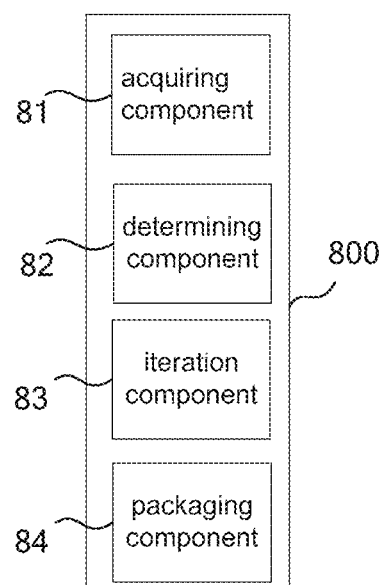
FIG. 8 is a structure diagram of a cyclic redundancy check apparatus provided by an embodiment of the present disclosure.

As still another aspect of the embodiment of the present disclosure, the embodiment of the disclosure provides a Cyclic Redundancy Check (CRC) apparatus. The cyclic redundancy check apparatus may achieve cyclic redundancy check by means of software and a universal hardware platform. In addition, a difference from the abovementioned embodiments lies in: the embodiment of the present disclosure may meet various application requirements through flexibly configuring various configuration information for indicating CRC check. Hereby, as shown in FIG. 8, the cyclic redundancy check apparatus 800 may include an acquiring component 81, a determining component 82, an iteration component 83 and a packaging component 84.

The acquiring component 81 is configured to acquire configuration information and an information field. The determining component 82 is configured to determine a generator polynomial and a coefficient corresponding to each power in the generator polynomial according to the configuration information. The iteration component 83 is configured to implement iteration for the information field according to the coefficient corresponding to the each power in the generator polynomial, as to output an iteration result. The packaging component 84 is configured to package the information field according to the iteration result.

The configuration information may include a CRC type, the generator polynomial, a CRC initial value, information field overturning information and iteration result exclusive-or calculation and overturning information. The configuration information is used for indicating that the cyclic redundancy check apparatus 800 selects the corresponding configuration information to complete the CRC check and processing of output data. The CRC type may include any one of the follows: CRC4, CRC7, CRC8, CRC12, CRC16 and CRC32. The generator polynomial may include a generator polynomial type and the coefficient corresponding to the each power in the generator polynomial, herein, the generator polynomial type may correspond to the CRC type, and a user may define the generator polynomial type and the coefficient corresponding to the each power in the generator polynomial voluntarily according to a protocol or a product demand. The CRC initial value is applied to initialization, herein, the CRC initial value may be a value defined in the protocol or an output value acquired after a last parallel iteration, and a bit number of the CRC initial value is associated with that of the parallel iteration. The information field overturning information is used for indicating that the acquiring component 81 implements overturning for each information code of the information field in advance according to the protocol. The iteration result exclusive-or calculation and overturning information is used for indicating that the packaging component 84 implements exclusive-or calculation and overturning for the iteration result.

For example, the configuration information may include the information field overturning information, the acquiring component 81 implements overturning in advance for the information field according to the information field overturning information, so as to conform to the protocol and output the corresponding pre-processed information field.

For example, the configuration information may include the CRC type or the generator polynomial. When the CRC type is CRC8 (CRC8=X8+X5+X4+1), a CRC arbitration component 32 may select the generator polynomial corresponding to the CRC8 for check, and determine g0=1, g1=g2=g3=g4=0, g5=g6=1,g7=0, g8=1. When the CRC type is CRC16, similarly, the corresponding generator polynomial may be determined to be checked. Of course, the user may select a self-defined generator polynomial to check rather than select a standard CRC type, for example, g(x)=x5+x3+1. At the moment, the determining component 82 determines that a coefficient of a quintic power is 1, a coefficient of a cubic power is 1, a coefficient of a zero power is 1, and coefficients of a first power, a quadratic power and a quartic power are 0 according to the generator polynomial.

In some embodiments of the disclosure, the configuration information may include the CRC initial value. When the CRC initial value is 01010101, the iteration component 83 may receive an input of the CRC initial value and the information field at the same time, for iteration.

The information field is communication data sent to a receiver from a sender, and is a binary sequence.

To sum up, with the adoption of the cyclic redundancy check apparatus 800, on one hand, the parallel iteration of the information field may be completed with a clock signal of one period 1T only, in this way an efficiency of CRC calculation may be improved. On the other hand, the various configuration information may be flexibly configured, as to adapt to various CRC calculation requirements.

In addition, because a conception of the cyclic redundancy check apparatus 800 is the same as that of the cyclic redundancy check circuit as described in abovementioned embodiments for achievement of the CRC check, the embodiment of the cyclic redundancy check apparatus 800 may quote contents of the abovementioned embodiments without conflict with the contents, and the contents will not be repeated here.

In some embodiments, the configuration information may include the CRC initial value, therefore the iteration component 83 is specifically configured to implement the parallel iteration for the information field according to the coefficient corresponding to the each power in the generator polynomial, as to output the iteration result.

In some embodiments, the configuration information may include the CRC type and the various coefficients of the generator polynomial, therefore the determining component 84 is specifically configured to determine the generator polynomial type and the coefficient corresponding to the each power of the generator polynomial according to the CRC type and the various coefficients of the generator polynomial.

Figure 9:
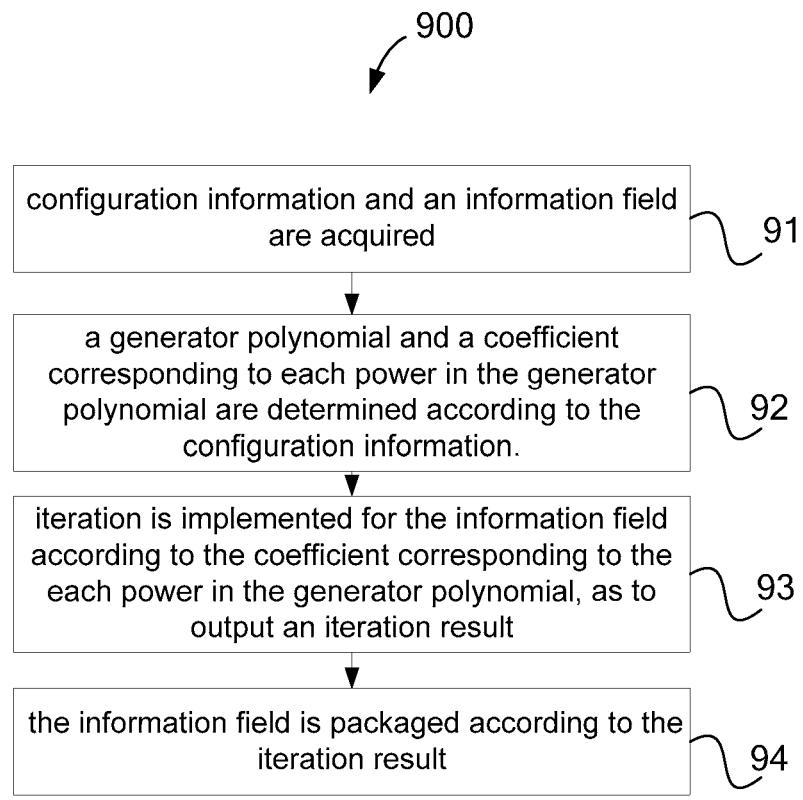
FIG. 9 is a flow diagram of a cyclic redundancy check method provided by an embodiment of the present disclosure.

As still another aspect of the embodiment of the present disclosure, the embodiment of the present disclosure provides a Cyclic Redundancy Check (CRC) method. A difference from the abovementioned embodiments lies in: as an alternative, the embodiment of the present disclosure may meet various application requirements through flexibly configuring various configuration information for indicating CRC check. As shown in FIG. 9, the cyclic redundancy check method 900 may include the following steps.

Step 91, configuration information and an information field are acquired.

Step 92, a generator polynomial and a coefficient corresponding to each power in the generator polynomial are determined according to the configuration information.

Step 93, iteration is implemented for the information field according to the coefficient corresponding to the each power in the generator polynomial, as to output an iteration result.

Step 94, the information field is packaged according to the iteration result.

The configuration information may include a CRC type, the generator polynomial, a CRC initial value, information field overturning information and iteration result exclusive-or calculation and overturning information. The configuration information is used for indicating that a cyclic redundancy check apparatus 800 selects the corresponding configuration information to complete CRC check and processing of output data. The CRC type may include any one of the follows: CRC4, CRC7, CRC8, CRC12, CRC16 and CRC32. The generator polynomial may include a generator polynomial type and the coefficient corresponding to the each power in the generator polynomial, herein, the generator polynomial type may correspond to the CRC type, and a user may define the generator polynomial type and the coefficient corresponding to the each power in the generator polynomial voluntarily according to a protocol or a product demand. The CRC initial value is applied to initialization, herein, the CRC initial value may be a value defined in the protocol or an output value acquired during a last parallel iteration, and a bit number of the CRC initial value is associated with that of the parallel iteration. The information field overturning information is used for implementing overturning for each information code of the information field in advance according to the protocol. The iteration result exclusive-or calculation and overturning information is used for implementing exclusive-or calculation and overturning for the iteration result.

For example, the configuration information may include the information field overturning information; the overturning is implemented for the information field in advance according to the information field overturning information, so as to conform to the protocol and output the corresponding pre-processed information field.

For example, the configuration information may include the CRC type or the generator polynomial. When the CRC type is CRC8 (CRC8=X8+X5+X4+1), a CRC arbitration component 32 may select the generator polynomial corresponding to the CRC8 for check, and determine g0=1, g1=g2=g3=g4=0, g5=g6=1, g7=0, g8=1. When the CRC type is CRC16, similarly, the corresponding generator polynomial may be determined to be checked. Of course, the user may select a self-defined generator polynomial to check rather than select a standard CRC type, for example, g(x)=x5+x3+1. At the moment, that a coefficient of a quintic power is 1, a coefficient of a cubic power is 1, a coefficient of a zero power is 1, and coefficients of a first power, a quadratic power and a quartic power are 0 is determined according to the generator polynomial.

For another example, the configuration information may include the CRC initial value. When the CRC initial value is 01010101, an input of the CRC initial value and the information field may be received at the same time, for iteration.

The information field is communication data sent to a receiver from a sender, and is a binary sequence.

To sum up, with the adoption of the cyclic redundancy check method 900, on one hand, the parallel iteration of the information field may be completed with a clock signal of one period 1T only, in this way an efficiency of CRC calculation may be improved. On the other hand, the various configuration information may be flexibly configured, as to adapt to various CRC calculation requirements.

In some embodiments, the configuration information may include the CRC initial value. The step 93 may include: the parallel iteration is implemented for the information field according to the coefficient corresponding to the each power in the generator polynomial and the CRC initial value, as to output the iteration result.

In some embodiments, the configuration information may include the CRC type and various coefficients of the generator polynomial. The step 92 may include: the generator polynomial type and the coefficient corresponding to the each power in the generator polynomial are determined according to the CRC type and the various coefficients of the generator polynomial.

Through description of the above embodiments, those skilled in the art may clearly know that each embodiment may achieve the cyclic redundancy check method by means of software and a universal hardware platform, of course, as an alternative, by hardware. In addition, because a conception of the cyclic redundancy check method is the same as that of the cyclic redundancy check apparatus as described in abovementioned embodiments for achievement of cyclic redundancy check, the embodiments of the cyclic redundancy check method may quote the contents of the abovementioned embodiments without conflict with the contents, and the contents will not be repeated here.

Figure 10:
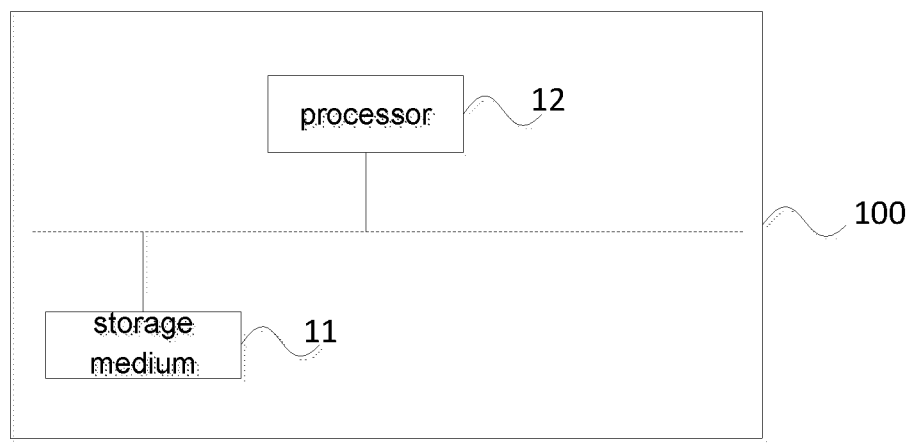
FIG. 10 is a structure diagram of an electronic device provided by an embodiment of the present disclosure.

As another aspect of the embodiment of the present disclosure, the embodiment of the present disclosure provides an electronic device. As shown in FIG. 10, the electronic device 100 may include a storage medium 11 and a processor 12, the processor 12 may be connected with the storage medium 11 through a bus or other modes, and connection through the bus is taken as an example in FIG. 10. The storage medium, as a non-volatile computer readable storage medium, may be applied to storage of a non-volatile software program, a non-volatile computer executable instruction and a component, such as a program instruction/component corresponding to a Cyclic Redundancy Check (CRC) method in the embodiment of the present disclosure. The processor 12 runs the non-volatile software program, the instruction and the component in the memory 11, to implement various function applications and data processing of the cyclic redundancy check method, namely, to achieve functions of each component of the cyclic redundancy check method of the abovementioned method embodiment.

The storage medium 11 may include a high-speed Random Access Memory (RAM), and may further include a non-volatile memory, such as at least one disk storage device, a flash device, or other non-volatile solid storage devices. In some embodiments, the storage medium 11 may optionally include the memories remotely configured relative to the processor 12, and these remote memories may be connected to the processor 12 through a network. Examples of the abovementioned network may include, but are not limited to, the Internet, the Intranet, a local area network, a mobile communication network and a combination thereof.

The program instruction/component is stored in the memory 11. The cyclic redundancy check method in any one of the abovementioned method embodiments, for example, the functions of all steps described above, may be implemented when the program instruction/component is implemented by one or more processors 12.

The embodiment of the present disclosure further provides a non-volatile computer readable storage medium, the non-volatile computer readable storage medium stores an instruction executable by an electronic device, and the executable instruction may be implemented by one or more processors, for example, one processor 12 in FIG. 10. The abovementioned one or more processors may be made to implement the cyclic redundancy check method in any one of the abovementioned method embodiments, for example, the cyclic redundancy check method in any one of the abovementioned method embodiments.

The apparatus or device embodiments described above are merely illustrative, herein the unit components described as separate components may or may not be physically separated, and the components displayed by the component units may or may not be physical units, which may be positioned at one place or distributed to multiple network component units. Part or all of the components may be selected according to actual needs to achieve the purpose of the solution of the embodiment.

Through description of the above embodiments, those skilled in the art may clearly know that each embodiment may be achieved by means of software and a universal hardware platform, of course, as an alternative, by hardware. Based on such an understanding, the abovementioned technical solution substantially or parts making a contribution to the relevant art may be embodied in form of software product, and the computer software product may be stored in the computer readable storage medium, such as a Read-Only Memory (ROM)/a Random Access Memory (RAM), a magnetic disk and an optical disk, including a plurality of instructions used for enabling one computer device (which may be a personal computer, a server, a network device and the like) to implement the method of each embodiment or a certain part of the embodiment.

Finally, it is to be noted that the above embodiments are only used to illustrate the technical solutions of the present disclosure, and are not limited thereto. As an alternative, the technical features in the abovementioned embodiments or different embodiments may be combined under the concept of the present disclosure, the steps may be achieved in any order, there are many other variations of different aspects of the present disclosure as described above, and for the sake of brevity, they are not provided in the details. Although the present disclosure has been described in detail with reference to the foregoing embodiments, those skilled in the art should understand that the technical solutions described in the foregoing embodiments may be modified, or some technical features may be equivalently replaced, but these modifications and replacements do not make the essence of the corresponding technical solutions depart from the scope of the technical solutions of all embodiments of the application.

What is claimed is:

1. A Cyclic Redundancy Check (CRC) circuit, comprising a processor coupled with a memory, and the processor configured to execute programming units stored in the memory, wherein the programming units comprise:
 a configuration component, configured to acquire configuration information and an information field, wherein the configuration information is used for indicating that the CRC circuit selects corresponding configuration information to complete CRC check and processing of output data, the configuration information comprises at least one of: a CRC type, a generator polynomial, a CRC initial value, information field overturning information and iteration result exclusive-or calculation and overturning information, the CRC initial value is a value defined as an output value acquired after a last parallel iteration;

a CRC arbitration component, configured to determine a generator polynomial according to the configuration information;

a CRC control component, configured to respond to triggering of the CRC arbitration component and output a clock signal, a coefficient corresponding to each power in the generator polynomial and the information field;

the CRC circuit further comprises: a parallel iteration component, configured to respond to the clock signal and implement parallel iteration for the information field according to the coefficient corresponding to the each power in the generator polynomial, as to output an iteration result, wherein the parallel iteration for the information field is completed with the clock signal of one period; and the programming units further comprises: a CRC output component, configured to package the information field according to the iteration result wherein the parallel iteration component comprising i*j iteration units, each of the iteration units includes at least one multiplier and at least one exclusive-or calculator; a multiplier of the row i-1 and the line j-1 is configured to multiply a coefficient corresponding to a highest power by a CRC initial value corresponding to a highest bit and the coefficient of the corresponding power and output a multiplication result; an exclusive-or calculator of the row i-1 and the line 0 is configured to implement exclusive-or calculation for the multiplication result and the information value of the corresponding bit in the information field and output an output value of the iteration unit of the row i-1 and the line 0; an exclusive-or calculator of the row 0 and the line j is configured to implement the exclusive-or calculation for the multiplication result and the CRC initial value corresponding to a bit j-1 and output an output value of an iteration unit of the row 0 and the line j; an exclusive-or calculator of the row i and the line j is configured to implement the exclusive-or calculation for the multiplication result and the output value of the iteration unit of the row i-1 and the line j-1 and output the output value of the iteration unit of the row i and the line j, wherein both i and j are positive integers.

2. The circuit as claimed in claim 1, wherein, the configuration information comprises a (j-1)-bit CRC initial value, and the parallel iteration component comprises i*j iteration units;

an iteration unit in a row i-1 and a line 0 is configured to receive an information value of a corresponding bit in the information field;

an iteration unit in a row 0 and a line j-1 is configured to respond to the clock signal and calculate an output value of the iteration unit in the row 0 and the line j-1 according to the CRC initial value and the coefficient of the corresponding power in the generator polynomial; and an iteration unit in a row i and a line j is configured to respond to the clock signal and calculate an output value of the iteration unit in the row i and the line j according to an output value of an iteration unit in the row i-1 and the line j-1 and the coefficient of the corresponding power in the generator polynomial.

3. The circuit as claimed in claim 2, wherein, each of the iteration units comprises at least one multiplier and at least one exclusive-or calculator;

a multiplier of the row i-1 and the line j-1 is configured to multiply a coefficient corresponding to a highest power by a CRC initial value corresponding to a highest bit and the coefficient of the corresponding power, and output a multiplication result;

an exclusive-or calculator of the row i-1 and the line 0 is configured to implement exclusive-or calculation for the multiplication result and the information value of the corresponding bit in the information field, and output an output value of the iteration unit of the row i-1 and the line 0;

an exclusive-or calculator of the row 0 and the line j is configured to implement the exclusive-or calculation for the multiplication result and the CRC initial value corresponding to a bit j-1, and output an output value of an iteration unit of the row 0 and the line j; and an exclusive-or calculator of the row i and the line j is configured to implement the exclusive-or calculation for the multiplication result and the output value of the iteration unit of the row i-1 and the line j-1, and output the output value of the iteration unit of the row i and the line j.

4. The circuit as claimed in claim 3, wherein, the configuration information comprises a CRC type and various coefficients of the generator polynomial;

the CRC arbitration component is configured to determine a generator polynomial type and the coefficient corresponding to the each power in the generator polynomial according to the CRC type and the various coefficients of the generator polynomial.

5. The circuit as claimed in claim 2, wherein, the configuration information comprises a CRC type and various coefficients of the generator polynomial;

the CRC arbitration component is configured to determine a generator polynomial type and the coefficient corresponding to the each power in the generator polynomial according to the CRC type and the various coefficients of the generator polynomial.

6. The circuit as claimed in claim 1, wherein, the configuration information comprises a CRC type and various coefficients of the generator polynomial;

the CRC arbitration component is configured to determine a generator polynomial type and the coefficient corresponding to the each power in the generator polynomial according to the CRC type and the various coefficients of the generator polynomial.

7. The circuit as claimed in claim 6, wherein, the CRC type comprises any one of the following: CRC4, CRC7, CRC8, CRC12, CRC16 and CRC32.

8. A chip, comprising the cyclic redundancy check (CRC) circuit as claimed in claim 1.

9. A Cyclic Redundancy Check (CRC) method, comprising:

acquiring, by a processor, configuration information and an information field, wherein the configuration information is used for indicating that the CRC circuit selects corresponding configuration information to complete CRC check and processing of output data, the configuration information comprises at least one of: a CRC type, a generator polynomial, a CRC initial value, information field overturning information and iteration result exclusive-or calculation and overturning information, the CRC initial value is a value defined as an output value acquired after a last parallel iteration;

determining, by the processor, a generator polynomial and a coefficient corresponding to each power in the generator polynomial according to the configuration information;

implementing, by a parallel iteration component, parallel iteration for the information field according to the coefficient corresponding to the each power in the generator polynomial, as to output an iteration result, wherein the parallel iteration for the information field is completed with the clock signal of one period; and packaging, by the processor, the information field according to the iteration result;

wherein the parallel iteration component comprising i*j iteration units, each of the iteration units includes at least one multiplier and at least one exclusive-or calculator; a multiplier of the row i-1 and the line j-1 is configured to multiply a coefficient corresponding to a highest power by a CRC initial value corresponding to a highest bit and the coefficient of the corresponding power and output a multiplication result; an exclusive-or calculator of the row i-1 and the line 0 is configured to implement exclusive-or calculation for the multiplication result and the information value of the corresponding bit in the information field and output an output value of the iteration unit of the row i-1 and the line 0; an exclusive-or calculator of the row 0 and the line j is configured to implement the exclusive-or calculation for the multiplication result and the CRC initial value corresponding to a bit j-1 and output an output value of an iteration unit of the row 0 and the line j; an exclusive-or calculator of the row i and the line j is configured to implement the exclusive-or calculation for the multiplication result and the output value of the iteration unit of the row i-1 and the line j-1 and output the output value of the iteration unit of the row i and the line j, wherein both i and j are positive integers.

10. The method as claimed in claim 9, wherein, the configuration information comprises a CRC initial value;

and implementing the parallel iteration for the information field according to the coefficient corresponding to the each power in the generator polynomial, as to output the iteration result comprises:

implementing the parallel iteration for the information field according to the coefficient corresponding to the each power in the generator polynomial and the CRC initial value, as to output the iteration result.

11. The method as claimed in claim 9, wherein, the configuration information comprises a CRC type and various coefficients of the generator polynomial; and determining the generator polynomial and the coefficient corresponding to the each power in the generator polynomial according to the configuration information comprises:

determining a generator polynomial type and the coefficient corresponding to the each power in the generator polynomial according to the CRC type and the various coefficients of the generator polynomial.

12. A non-volatile computer readable storage medium, the non- volatile computer readable storage medium storing an instruction executable by an electronic device, and the executable instruction being used for making the electronic device implement the cyclic redundancy check (CRC) method as claimed in claim 9.

13. An electronic device, comprising:
at least one processor; and
a memory which is in communication connection with the at least one processor, wherein, the memory stores an instruction executable by the at least one processor, and the instruction is implemented by the at least one processor, as to make the at least one processor be applied to the cyclic redundancy check (CRC) method as claimed in claim 9.

14. A Cyclic Redundancy Check (CRC) apparatus, comprising a processor; and
a memory which is in communication connection with the at least one processor, wherein, the memory stores an instruction executable by the at least one processor, and the instruction is implemented by the at least one processor CRC output component:
an acquiring component, configured to acquire configuration information and an information field;
a determining component, configured to determine a generator polynomial and a coefficient corresponding to each power in the generator polynomial according to the configuration information;
an iteration component, configured to implement parallel iteration for the information field according to the coefficient corresponding to the each power in the generator polynomial, as to output an iteration result, wherein the parallel iteration for the information field is completed with the clock signal of one period; and
a packaging component, configured to package the information field according to the iteration result;
the configuration information comprises a CRC initial value, the CRC initial value is a value defined as an output value acquired after a last parallel iteration.

15. The apparatus as claimed in claim 14, wherein
the iteration component is specifically configured to:
implement the parallel iteration for the information field according to the coefficient corresponding to the each power in the generator polynomial and the CRC initial value, as to output the iteration result.

16. The apparatus as claimed in claim 14, wherein, the configuration information comprises a CRC type and various coefficients of the generator polynomial; and
the determining component is specifically configured to:
determine a generator polynomial type and the coefficient corresponding to the each power in the generator polynomial according to the CRC type and the various coefficients of the generator polynomial.

* * * * *